United States Patent [19]

Kim

[11] Patent Number: 5,304,737
[45] Date of Patent: Apr. 19, 1994

[54] SEMICONDUCTOR PACKAGE

[75] Inventor: Jin Sung Kim, Seoul, Rep. of Korea

[73] Assignee: Goldstar Electron Co., Ltd., Rep. of Korea

[21] Appl. No.: 955,676

[22] Filed: Oct. 2, 1992

[30] Foreign Application Priority Data

Oct. 15, 1991 [KR] Rep. of Korea ............... 17136/1991

[51] Int. Cl.$^5$ ...................... H01L 23/02; H01L 23/28
[52] U.S. Cl. ................................... 174/52.4; 174/52.2; 257/787; 361/728; 361/775
[58] Field of Search ............................ 174/52.2, 52.4; 257/787; 361/407, 421, 392

[56] References Cited

U.S. PATENT DOCUMENTS

| | | | |
|---|---|---|---|
| 4,208,698 | 6/1980 | Narasimhan | 361/414 |
| 4,534,105 | 8/1985 | Reusch | 29/589 |
| 4,641,114 | 2/1987 | Person | 333/161 |

*Primary Examiner*—Leo P. Picard
*Assistant Examiner*—Bot Ledinh
*Attorney, Agent, or Firm*—Scully, Scott, Murphy & Presser

[57] ABSTRACT

A semiconductor package comprising a connection pad device for electrically connecting at least a part of chip pads of a semiconductor chip with the corresponding inner leads of a lead frame. The connection pad device comprises a film as a connection pad device body, a plurality of copper foil wirings each having one end positioned to correspond to each chip pad of the semiconductor chip and the other end positioned to correspond to each inner lead of the lead frame, a plurality of first jumper pads protruded from the film, each of the first jumper pads being connected to one end of each corresponding copper foil wiring and wire-bonded to each corresponding chip pad, and a plurality of second jumper pads protruded from the film, each of the second jumper pads being connected to the other end of each corresponding copper foil wiring and wire-bonded to each corresponding inner lead. With the connection pad device, the semiconductor package can cope properly with various package types and have improvements in the degree of freedom in designing layouts of the semiconductor chip and lead frame.

7 Claims, 3 Drawing Sheets

SEMICONDUCTOR PACKAGE

BACKGROUND OF THE INVENTION

1. Field of the Invention

The present invention relates to a semiconductor package, and more particularly to a semiconductor package capable of freely coping with various package types such as a SOJ type, ZIP type and etc. without changing the type of a semiconductor chip to be used, upon packaging a highly integrated memory of a 16-mega-bit grade or greater and improving the degree of freedom in designing a layout of the pads of semiconductor chip, thereby improving the characteristic of a semiconductor device to be manufactured and the degree of integration.

2. Description of the Prior Art

Generally, a semiconductor package is made by wire-bonding inner leads of a lead frame to corresponding pads of a semiconductor chip and then molding the semiconductor chip using a resin material.

FIG. 1 is a plan view showing the connection between a semiconductor chip and a lead frame in a semiconductor package of a general small outline J bend (SOJ) type. FIG. 2 is a sectional view of a typical example of such a general SOJ type semiconductor package. As shown in the drawings, the semiconductor chip which is denoted by the reference numeral 3 is attached to a paddle 2 of the lead frame 1, by means of an epoxy adhesive 8. The semiconductor chip 3 has a plurality of pads 4 including pads 4a, 4b and 4c which are connected with inner leads 5 of the lead frame 1 by means of wires 6. The semiconductor chip 3 and the inner leads 5 of the lead frame 1 are molded with an epoxy resin 7.

In such a SOJ type semiconductor package, the semiconductor chip 3 has a source pad 4a at the lower end of one side portion thereof and a ground pad 4b at the upper end of the other side portion thereof, as shown in FIG. 2. The reference numeral 4c denotes general pads for inputting and outputting signals.

For wire-bonding the inner leads 5 of lead frame 1 to the corresponding pads 4 formed on the semiconductor chip 3 by means of metal wires 6, a layout for the semiconductor chip 3 is designed to allow the space between each inner lead 5 of the lead frame 1 and each corresponding pad 4 of the semiconductor chip 3 to be not more than 200 MIL (1 MIL = 1/1000 inch).

For the same purpose, it is also necessary to provide a design space allowing each inner lead of the lead frame to be designed to correspond to the position at which each corresponding pad is formed. For example, in semiconductor packages of a 16-mega-bit DRAM grade, such a design space should be not less than 50 MIL in both X-axis and Y-axis directions.

The outline size of semiconductor package is also fixed for providing a compatibility of the semiconductor package. For example, semiconductor packages of the 16-mega-bit DRAM grade have the outline size of 400 mm × 725 mm. As a result, in case of a small-sized semiconductor chip, pads are formed at corner portions of the semiconductor chip. In this case, a lead frame is designed such that its inner leads correspond to the pads formed at the corner portions of semiconductor chip, so as to be wire-bonded thereto.

In case of a highly integrated semiconductor chip of the 16-mega-bit DRAM grade or greater, that is, a large-sized semiconductor chip, in particular, in case of a SOJ type semiconductor package having outer leads protruded from its opposite sides as shown in FIGS. 1 and 2, pads 4 are formed at opposite side edges of the semiconductor chip and are wire-bonded to the corresponding inner leads 5 arranged at opposite sides of the lead frame 1. On the other hand, in case of a semiconductor package of a zigzag inline package (ZIP) type, pads are formed at the corner portions of the semiconductor chip by using option pads, so as to cope with a variation in the type of package.

In such conventional packages with the above-mentioned structures, electric power is supplied to an internal circuit of the semiconductor chip 3 via specific outer leads of the lead frame 1, that is, a source terminal Vcc and a ground terminal Vss. Via the remaining outer leads, that is, signal terminals, signal inputting and outputting are carried out between the internal circuit of the semiconductor chip 3 and the external of the package.

Typically, the positions of source terminal Vcc and ground terminal Vss which are specific outer leads of the semiconductor package are fixed. As a result, the positions of source pad and ground pad are also fixed, to which inner leads connected to the source terminal Vcc and ground terminal Vss are wire-bonded. In case of the SOJ type semiconductor package, therefore, the source pad and the ground pad are formed at the lower end of one side portion and the upper end of the other side portion of semiconductor chip.

Such a limitation on the positions of source pad and ground pad becomes a factor of limiting the design of semiconductor chips. On the other hand, source lines made of metal are disposed in the semiconductor chip and connected in parallel to various internal circuit parts, so as to supply electric power thereto. These source lines have various and long lengths, thereby causing the degree of freedom in designing the semiconductor chip to be very limited. They also effect adversely an accurate supplying of static voltage to each internal circuit part. Since the source lines also have a width very larger than those of other signal lines, they occupy a great area in the semiconductor chip, if their length increases. As a result, there are problems of degrading the degree of integration and requiring an increase in chip area. The arrangement of various source lines also becomes a factor of generating a noise. The increased length of source lines results in a decrease in speed, thereby causing the performance of semiconductor chip to be degraded.

Where both a SOJ type package and a ZIP type package are to be made with semiconductor chips of the same kind, there is no problem when the chips have a small size. In case of the semiconductor chips having a large size, however, there is a problem that pad positions for the SOJ type package should be designed differently from those for the ZIP type package.

SUMMARY OF THE INVENTION

Therefore, an object of the invention is to provide a semiconductor package capable of freely coping with various package types such as a SOJ type, ZIP type and etc. without changing the type of a semiconductor chip to be used, upon packaging a highly integrated memory of a 16-mega-bit grade or greater.

Another object of the invention is to provide a semiconductor package having a semiconductor chip provided with a plurality of source pads and a plurality of ground pads, thereby capable of supplying a stable static voltage to internal circuit parts of the semiconductor chip and reducing the length of each source line in the semiconductor chip.

Still another object of the invention is to provide a semiconductor package capable of easily wire-bonding inner leads of a lead frame to pads of a semiconductor chip, irrespective of the positions of the pads on the semiconductor chip, thereby improving the degree of freedom in designing a layout of the pads of semiconductor chip, the characteristic of a semiconductor device to be manufactured and the degree of integration.

In accordance with the present invention, this object can be accomplished by providing a semiconductor package comprising a lead frame having a paddle and a plurality of inner leads and a semiconductor chip having a plurality of chip pads electrically connected with the corresponding inner leads of the lead frame, the semiconductor chip being molded together with the inner leads, the semiconductor package further comprising: a connection pad device for electrically connecting at least a part of the chip pads of the semiconductor chip with the corresponding inner leads of the lead frame.

The connection pad device comprises a film as a connection pad device body, a plurality of copper foil wirings each having one end positioned to correspond to each chip pad of the semiconductor chip and the other end positioned to correspond to each inner lead of the lead frame, a plurality of first jumper pads protruded from the film, each of the first jumper pads being connected to one end of each corresponding copper foil wiring and wire-bonded to each corresponding chip pad, and a plurality of second jumper pads protruded from the film, each of the second jumper pads being connected to the other end of each corresponding copper foil wiring and wire-bonded to each corresponding inner lead.

With this arrangement, electrical connection between each chip pad of the semiconductor chip and each corresponding inner lead of the lead frame is achieved by the connection pad device. The semiconductor chip has a plurality of source pads electrically connected, in common, to one inner lead of the lead frame as a source terminal by means of the connection pad device and a plurality of ground pads electrically connected, in common, to another inner lead of the lead frame as a ground terminal by means of the connection pad device. Accordingly, the semiconductor package of the present invention can cope easily with various package types such as a SOJ type, ZIP type and etc. without changing the type of a semiconductor chip to be used.

BRIEF DESCRIPTION OF THE DRAWINGS

Other objects and aspects of the invention will become apparent from the following description of embodiments with reference to the accompanying drawings in which.

DESCRIPTION OF THE PREFERRED EMBODIMENTS

Figure 1:
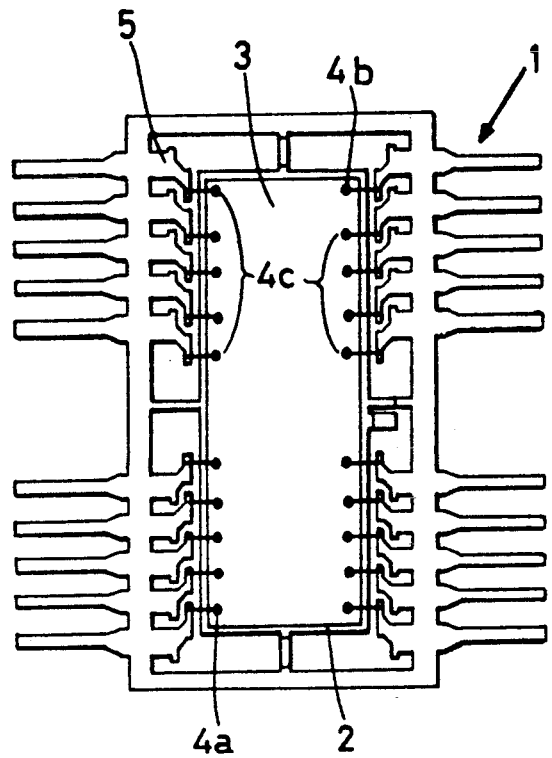
FIG. 1 is a plan view showing the connection between a semiconductor chip and a lead frame in a SOJ type semiconductor package.
Figure 2:
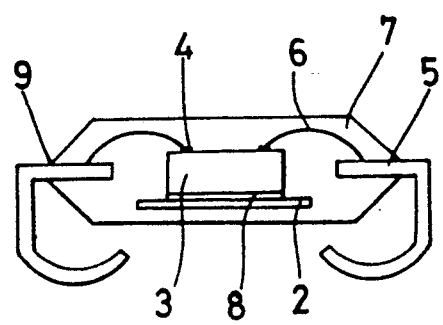
FIG. 2 is a sectional view of a typical SOJ type semiconductor package.
Figure 3:
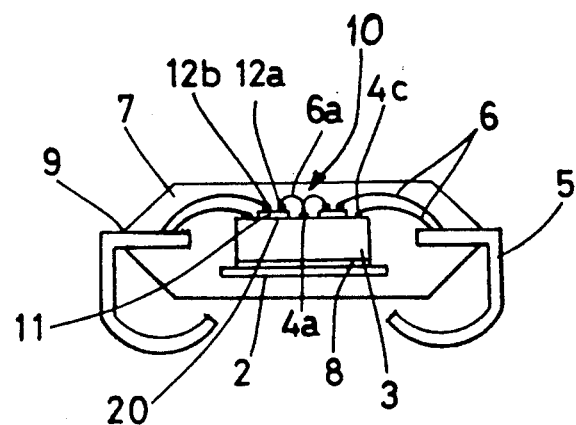
FIG. 3 is a sectional view of a SOJ type semiconductor package in accordance with the present invention.

Referring to FIG. 3, there is illustrated a semiconductor package in accordance with the present invention. As shown in FIG. 3, the semiconductor package comprises a lead frame 1 having a paddle 2 and a semiconductor chip 3 attached to the paddle 2 of lead frame 1 by means of an adhesive 8. To the upper surface of semiconductor chip 3 is attached a connection pad device 10 which has first jumper pads 12a bonded to chip pads 4 of the semiconductor chip 3 by means of wires 6 and second jumper pads 12b bonded to inner leads 5 of the lead frame 1 by means of wires 6. The semiconductor chip 3 and the inner leads 5 of lead frame 1 are molded with a molding resin 7.

The attachment of the connection pad device 10 to the upper surface of semiconductor chip 3 is achieved by using an epoxy adhesive 20 or a lamination method.

Figure 4:
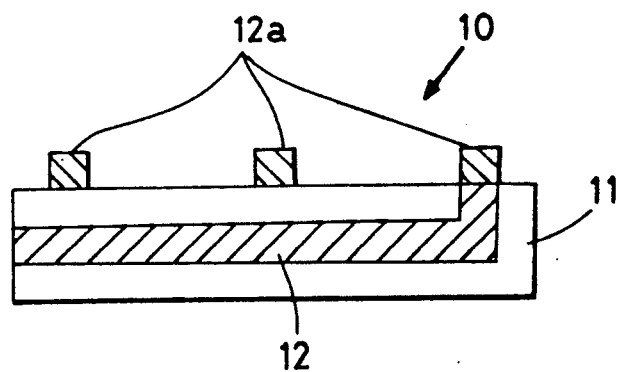
FIG. 4 is a sectional view of a connection pad device in accordance with the present invention.

As shown in FIG. 4, the connection pad device 10 comprises a thermosetting polyimide film 11 as a connection pad device body. On the surface of thermosetting polyimide film 11, the first jumper pads 12a are formed at positions corresponding to chip pads 4 of the semiconductor chip 3. In similar, the second jumper pads 12b are formed on the surface of thermosetting polyimide film 11, at positions corresponding to inner leads 5 of the lead frame 1. A plurality of copper foil wirings 12 are embedded in the thermosetting polyimide film 11, so as to electrically connect the first jumper pads 12a with the corresponding second jumper pads 12b, respectively.

The copper foil wirings 12 are arranged in the thermosetting polyimide film 11 in a single-layered or multi-layered manner and to extend freely in X-axis and Y-axis directions.

Preferably, the thermosetting polyimide film 11 of connection pad device 10 has a thickness of 10 μm to 300 μm. It is also most preferred that the copper foil wirings 12 have a thickness of 10 μm to 100 μm, a strength of 1,400 kg/cm$^2$ or more, and a space of 50 μm or more between adjacent copper foil wirings 12.

Assembling of the semiconductor package with the above-mentioned construction according to the present invention will now be described.

First, the connection pad device 10 according to the present invention is designed and manufactured to have an arrangement corresponding to arrangements of the pads of semiconductor chip 3 and the inner leads 5 of lead frame 1. That is, a plurality of copper foil wirings 12 are arranged in the thermosetting polyimide film 11 of the connection pad device 10 such that they correspond at respective one ends thereof to the chip pads 4 of semiconductor chip 3 and at respective other ends thereof to the inner leads 5 of lead frame 1. To respective one ends of copper foil wirings 12 are connected the first jumper pads 12a which are protruded from the upper surface of thermosetting polyimide film 11. To respective other ends of copper foil wirings 12 are connected the second jumper pads 12a which are protruded from the upper surface of thermosetting polyimide film 11.

Each first jumper pad 12a of the connection pad device 10 is arranged to be spaced from each corresponding pad 4 of the semiconductor chip 3 at a distance allowing its wire-bonding to the pad 4. In similar, each second jumper pad 12b of the connection pad device 10 is arranged to be spaced from each corresponding inner lead 5 of the lead frame 1 at a distance allowing its wire-bonding to the inner lead 5.

As above-mentioned, the connection pad device 10 is designed and manufactured to correspond the chip pads 4 of semiconductor chip 3 and the inner leads 5 of lead frame 1. This connection pad device 10 is attached to the upper surface of the semiconductor chip 3 fixed to the paddle 2 of lead frame 1. The attachment of the connection pad device 10 to the upper surface of semiconductor chip 3 is achieved by using an adhesive or a lamination method for laminating the connection pad device 10 over the upper surface of semiconductor chip 3. Thereafter, the first jumper pads 12a of connection pad device 10 are wire-bonded to the chip pads 4 of semiconductor chip 3, respectively. Simultaneously, the second jumper pads 12b of connection pad device 10 are wire-bonded to the inner leads 5 of lead frame 1, respectively. Subsequently, a molding process, a trimming process and a forming process are carried out for completing the manufacture of the semiconductor package.

Now, an example of a semiconductor package with the above-mentioned connection pad device according to the present invention will be described.

Figure 5:
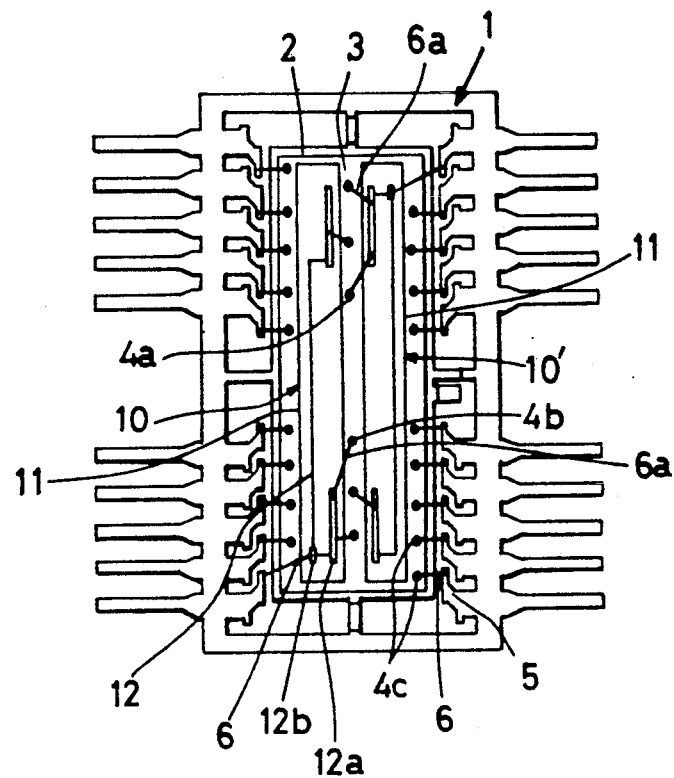
FIG. 5 is a plan view showing the internal structure of a SOJ type semiconductor package having a plurality of source pads in accordance with the present invention.

FIG. 5 is a plan view showing the internal structure of a SOJ type semiconductor package having a plurality of source pads in accordance with the present invention. In FIG. 5, the same reference numerals as in FIG. 3 denote the same elements. As shown in FIG. 5, the semiconductor package comprises a lead frame 1 having a paddle 2 and a semiconductor chip 3 having a plurality of source pads 4a for applying electric power to certain parts of the semiconductor chip 3 and a plurality of ground pads 4b. The semiconductor chip 3 is also provided at its opposite side edges with a plurality of signal inputting/outputting pads 4c. This semiconductor chip 3 is attached to the paddle 2 of lead frame 1. To predetermined portions of the upper surface of semiconductor chip 3 are attached two connection pad devices 10 and 10' each having first and second jumper pads 12a and 12b. In case of FIG. 5, each connection pad device has two elongated first jumper pads 12a and one second jumper pad 12b. In place of the elongated shape, each first jumper pad 12a may be constituted by a plurality of separate small jumper pads. To each first jumper pad 12a of one connection pad device 10, source pads 4a formed at the center portion of semiconductor chip 3 are wire-bonded in common. On the other hand, the second jumper pad 12b is wire-bonded to an inner lead of lead frame 1 as a source terminal. In similar, source pads 4b formed at the center portion of semiconductor chip 3 are wire-bonded, in common, to each first jumper pad 12a of the other connection pad device 10'. The second jumper pad 12b of the other connection pad device 10' is wire-bonded to an inner lead frame 1 as a ground terminal. On the other hand, signal inputting-/outputting pads 4c of the semiconductor chip 3 are wire-bonded to inner leads of lead frame 1 as signal inputting/outputting terminals.

With this arrangement, the source pads and ground pads of semiconductor chip 3 can be provided in multiple at desired positions. These source pads and ground pads are electrically connected to the source terminal inner lead and ground terminal inner lead of lead frame, respectively. Accordingly, it is possible to reduce the length of each source line in designing internal circuits of the semiconductor chip 3 and to increase the degree of freedom in design.

Figure 6:
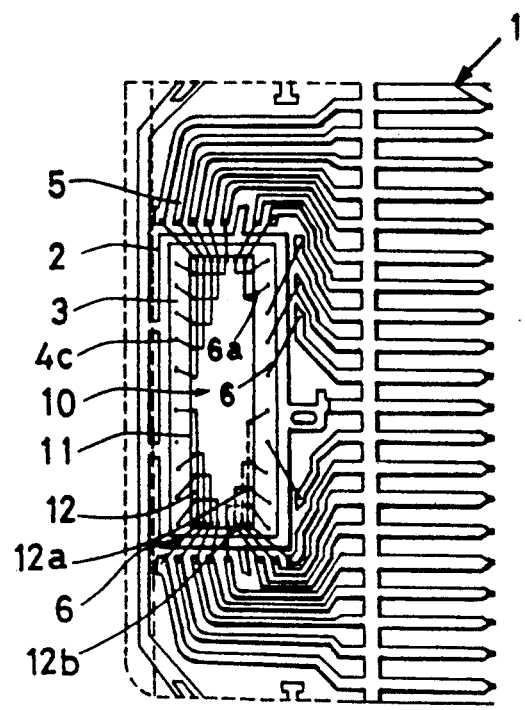
FIG. 6 is a plan view showing the internal structure of a ZIP type semiconductor package in accordance with the present invention.

On the other hand, FIG. 6 is a plan view showing the internal structure of a ZIP type semiconductor package according to the present invention. In FIG. 6, the same reference numerals as in FIG. 3 denote the same elements. As shown in FIG. 6, the semiconductor package comprises a lead frame 1 having a paddle 2 and a semiconductor chip 3 attached to the paddle 2 of lead frame 1. The semiconductor chip 3 has at its opposite side edges a plurality of chip pads 4. A connection pad device 10 having first and second jumper pads 12a and 12b is attached to the upper surface of semiconductor chip 3. The first jumper pads 12a of connection pad device 10 are bonded to the chip pads 4 of semiconductor chip 3 by means of wires 6, respectively. On the other hand, the second jumper pads 12b are bonded to the inner leads 5 of lead frame 1 by means of wires 6, respectively.

The first jumper pads 12a are arranged at opposite side edges of the connection pad device 10 so that they correspond to the chip pads 4 of semiconductor chip 3, so as to be wire-bonded to the chip pads 4, respectively. The second jumper pads 12b are arranged at corner portions of the connection pad device 10, so as to be wire-bonded to the inner leads 5 of the ZIP type, respectively. Accordingly, it is possible to connect the semiconductor chip 3 designed for the SOJ type to the lead frame designed for the ZIP type without using any option pads, so as to manufacture a semiconductor package of the ZIP type.

When a semiconductor package of the SOJ type is to be manufactured by using the semiconductor chip of the ZIP type provided at its corner portions with chip pads, a connection pad device is designed and manufactured to cope with the change of package type. That is, the connection pad device connects electrically the chip pads with the inner leads 5. Thus, the semiconductor chip having ZIP type chip pads can be easily used for manufacturing the semiconductor package of the SOJ type.

As apparent from the above description, the present invention provides a semiconductor package capable of freely changing source pads and ground pads of its semiconductor chip in number and position and thus improving the degree of freedom in designing the layout of the semiconductor chip. In particular, electric power can be stably supplied to internal circuit parts of the semiconductor chip in that the source pads and the ground pads can be provided in multiple, so that the semiconductor chip has improvements in reliance and speed. It is also possible to reduce the length of each internal source line in the semiconductor chip, thereby improving the degree of integration.

In addition, there are effects of increasing the degree of freedom in designing a lead frame, upon packaging a highly integrated memory of a 16-mega-bit grade or greater and freely coping with various package types such as a SOJ type, ZIP type and etc. without changing the type of a semiconductor chip to be used.

What is claimed is:

1. A semiconductor package comprising a lead frame having a paddle and a plurality of inner leads and a semiconductor chip having a plurality of chip pads electrically connected with the corresponding inner leads of the lead frame, the semiconductor chip being molded together with the inner leads, the semiconductor package further comprising:

a connection pad device for electrically connecting at least a portion of the plurality of chip pads of the semiconductor chip with the corresponding inner leads of the lead frame, said connection pad device comprising:

a film as a connection pad device body;

a plurality of copper foil wirings each having one end positioned to correspond to each chip pad of the semiconductor chip and the other end positioned to correspond to each inner lead of the lead frame;

a plurality of first jumper pads protruded from the film, each first jumper pad being connected to one end of each corresponding copper foil wiring and wire-bonded to each corresponding chip pad; and a plurality of second jumper pads protruded from the film, each second jumper pad being connected to the other end of each corresponding copper foil wiring and wire-bonded to each corresponding inner lead.

2. A semiconductor package in accordance with claim 1, wherein the connection pad device is attached to the upper surface of the semiconductor chip by using an epoxy adhesive.

3. A semiconductor package in accordance with claim 1, wherein the copper foil wirings are arranged in the film in a single-layered or multi-layered manner and to extend freely in X-axis and Y-axis directions.

4. A semiconductor package in accordance with claim 1, wherein the film of the connection pad device has a thickness of 10 $\mu$m to 300 $\mu$m and the copper foil wirings have a thickness of 10 $\mu$m to 100 $\mu$m, a strength of not less than 1,400 kg/cm$^2$, and a space of not less than 50 $\mu$m between adjacent copper foil wirings.

5. A semiconductor package in accordance with claim 1, wherein the connection between each chip pad of the semiconductor chip and each corresponding inner lead of the lead frame, the connection between each chip pad of the semiconductor chip and the connection pad device and the connection between the connection pad device and each inner lead of the lead frame are achieved by wires.

6. A semiconductor package in accordance with claim 1, wherein the semiconductor chip has a plurality of source pads electrically connected, in common, to one inner lead of the lead frame as a source terminal by means of the connection pad device and a plurality of ground pads electrically connected, in common, to another inner lead of the lead frame as a ground terminal by means of the connection pad device.

7. A semiconductor package in accordance with claim 1, wherein the connection pad device is attached to the upper surface of the semiconductor chip by using a lamination method.

* * * * *